(12) United States Patent
Kikutake et al.

(10) Patent No.: US 7,373,564 B2
(45) Date of Patent: May 13, 2008

(54) SEMICONDUCTOR MEMORY

(75) Inventors: Akira Kikutake, Kawasaki (JP);
Yasuhiro Onishi, Kawasaki (JP);
Kuninori Kawabata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 336 days.

(21) Appl. No.: 11/092,715

(22) Filed: Mar. 30, 2005

(65) Prior Publication Data
US 2006/0156212 A1 Jul. 13, 2006

(30) Foreign Application Priority Data
Dec. 21, 2004 (JP) ............................. 2004-369505

(51) Int. Cl.
*G11C 29/00* (2006.01)
(52) U.S. Cl. .................... 714/718; 714/42; 714/48; 714/719; 714/766; 714/800; 365/201
(58) Field of Classification Search ................... None
See application file for complete search history.

(56) References Cited

U.S. PATENT DOCUMENTS 5,903,582 A * 5/1999 Miyazaki .................... 714/800

6,466,490 B2 * 10/2002 Nagai et al. ............ 365/189.12
7,032,142 B2 * 4/2006 Fujioka et al. ............... 714/718

FOREIGN PATENT DOCUMENTS

JP          05-054697        3/1993

OTHER PUBLICATIONS

IBM Technical Disclosure Bulletin NN79054871, "Mechanism for Checking Parity And Error Checking And Correction Functions in Processors And Processor Linked Subsystems", May 1979, vol. 21, issue 12.*
IBM Technical Disclosure Bulletin NB8908370, "Integrated Error Correction/Test Memory Feature", Aug. 1989, vol. 32, issue 3B.*

* cited by examiner

*Primary Examiner*—John P Trimmings
(74) *Attorney, Agent, or Firm*—Arent Fox LLP

(57) ABSTRACT

A normal write data selection circuit operates in the normal operation mode, and thus outputs data received through external data terminals to any one of regular cell arrays selected according to an address. A test write control circuit operates in the test mode, and thus writes test data into a regular memory cell at a location corresponding to a location of a parity memory cell into which test parity data are written in each of regular cell arrays. Therefore, since a common test pattern can be used to test both the regular memory cell and the parity memory cell, test cost can be curtailed.

10 Claims, 11 Drawing Sheets

SEMICONDUCTOR MEMORY

CROSS REFERENCE TO RELATED APPLICATION

This application is based upon and claims the benefit of priority from Japanese Patent Application No. 2004-369505, filed on Dec. 21, 2004, the entire contents of which are incorporated herein by reference.

BACKGROUND OF THE INVENTION

1. Field of the Invention

The present invention relates to a semiconductor memory with an error correction function.

2. Description of the Related Art

A semiconductor memory with an error correction function includes regular cell arrays for storing data from the outside, and parity cell arrays for storing parity data of data written into the regular cell arrays. The parity data are generated corresponding to the write data by means of a parity generation circuit. It is therefore not easy to write predetermined data into the parity cell array. In consideration of this problem, there are disclosed technologies in which external parity data terminals for reading data from the parity cell arrays and writing data into the parity cell arrays are formed in a semiconductor memory, and data is directly written into the parity cell arrays and directly read from the parity cell arrays during the test mode, thereby saving test time (for example, Japanese Unexamined Patent Application Publication No. 5-54697).

Meanwhile, the ratio of the parity cell array occupied in the regular cell array is lowered as the bit number of data for generating parity data is increased. Thus, it has small influence on the chip size. For this reason, in this kind of a semiconductor memory, in order to minimize an increase in the chip size, there is a case where parity data are generated using data having a large bit width, which are written into a plurality of regular cell arrays to which different addresses are allocated. In this case, data supplied to external data terminals are written into any one of the regular cell arrays, which is selected according to an address. In parity memory cells, addresses correspond to a plurality of different regular memory cells. Thus, if the external parity data terminals are formed in this kind of the semiconductor memory, an address map of regular cell arrays and an address map of parity cell arrays are different during the test mode where the external parity data terminals are used.

In the event that the aforementioned semiconductor memory is tested, test data supplied to the external data terminals are written into any one of the regular memory cells of the regular cell array according to an address. The test parity data supplied to the external parity data terminals are written into any one of the parity memory cells of the parity cell array according to an address.

As described above, in the test mode, the address maps of the regular cell arrays and the parity cell arrays are different. Due to this, there is no co-relation in physical locations between the regular memory cell into which the test data are written, and the parity memory cell into which the parity test data are written. That is, the regular memory cell and the parity memory cell into which data are written do not exist relatively at the same location within the regular cell arrays and the parity cell arrays. Accordingly, in this kind of the semiconductor memory, there is a problem in that it is difficult to find the relation between a regular cell array where failure has occurred and a parity cell array. Further, in the case where failure occurring due to the interaction between data stored in memory cells is evaluated, it is necessary to generate test patterns for the regular cell array and the parity cell array, respectively, in order to evaluate their interaction. This results in an increase in the number of test patterns to be managed since the design time needed for the test patterns becomes lengthy. Furthermore, in a redundancy decision test for determining the use of a redundancy circuit that corrects failure, a redundancy decision test must be performed on a regular cell array and a parity cell array, respectively. Accordingly, there is a problem in that the test efficiency is low.

SUMMARY OF THE INVENTION

Accordingly, the present invention is designed to solve the above-mentioned problems, and it is an object of the present invention to curtail test cost in such a manner that when a semiconductor memory is tested, a physical location of a regular memory cell where data are read and written is made to correspond to a physical location of a parity memory cell.

In a semiconductor memory according to an aspect of the present invention, the semiconductor memory includes a plurality of regular cell arrays, and parity cell arrays where parity data of data written into the regular cell arrays are read and written. A normal write data selection circuit operates, in the normal operation mode, and thus outputs the data received through the external data terminals to any one of the regular cell arrays selected according to an address. A normal read data selection circuit operates, in the normal operation mode, and thus outputs the data read from any one of the regular cell arrays, which is selected according to the address, to the external data terminals.

A test write control circuit operates, in test mode, and thus writes the test data into a regular memory cell at a location corresponding to a location of a parity memory cell into which the test parity data are written in each of the regular cell arrays. A test read control circuit operates, in the test mode, and thus reads the test data from a regular memory cell at a location corresponding to a location of a parity memory cell from which the test parity data are read in each of the regular cell arrays. Due to this, in the semiconductor memory wherein any one of the regular cell arrays is accessed according to the address during the normal operation mode, data are written into the regular memory cell and the parity memory cell, which are located relatively at the same location within each of the regular cell arrays and the parity cell array, during the test mode, and the data are then read from these memory cells. Therefore, a common test pattern can be used in order to test the regular memory cell and the parity memory cell. It is also possible to easily find the relation between a regular cell array where failure has occurred and a parity cell array. As a result, the design time of test patterns can be reduced, and the time necessary for failure analysis can be thus reduced. This results in reduction in test cost.

In a semiconductor memory according to a preferred embodiment of the present invention, a test write data selection circuit of the test write control circuit selects a regular memory cell of each of the regular cell arrays, wherein the test data are written, according to the address. A parity write data selection circuit of the test write control circuit selects a parity memory cell of the parity cell array, wherein the test parity data are written, according to the address. A location of a regular memory cell and a parity memory cell, wherein data are written during the test mode, are switched to a location of a regular memory cell and a parity memory cell, wherein data are written during the normal operation mode, according to an address. Thus, data can be written into memory cells, which are relatively located at the same location, through a simple circuit.

In a semiconductor memory according to a preferred embodiment of the present invention, the regular cell arrays and the parity cell array are each composed of a plurality of segments. The total number of the segments of the regular cell arrays is the same as those of the external data terminals. The total number of the segments of the parity cell array is the same as those of the external parity data terminals. The test write data selection circuit writes the test data received through each of the external data terminals into each of the segments of the regular cell arrays, during the test mode. The parity write data selection circuit writes the test parity data received through each of the external parity data terminals into each of the segments of the parity cell array, during the test mode.

Writing of data during the test mode is carried out on a segment basis in accordance with the array structure of a semiconductor memory. The test write data selection circuit can be thus constructed using a plurality of sub-circuits in which logic states are the same corresponding to segments. In the same manner, the parity write data selection circuit can be also constructed using a plurality of sub-circuits in which logic states are the same corresponding to segments. Therefore, the logic designs of a test write data selection circuit and a parity write data selection circuit are facilitated.

In a semiconductor memory according to a preferred embodiment of the present invention, a plurality of data lines are connected to the segments of the regular cell arrays, respectively. A test write address decoder and a write data output circuit of the test write data selection circuit are formed every segment. The test write address decoder activates any one of the plurality of write decode signals according to an address. The write data output circuit outputs the test data to any one of the data lines according to a write decode signal. Therefore, a test write address decoder and a write data output circuit both of which correspond to one segment can be applied to test write address decoders and write data output circuits all of which correspond to a plurality of different segments. It is thus possible to cut down on a logic design period and a design verification period.

In a semiconductor memory according to a preferred embodiment of the present invention, a test read data selection circuit of the test read control circuit selects any one of plural bits of test data that are read from the regular memory cells of each of the regular cell arrays according to an address, and outputs the selected bit to the external data terminals. A parity read data selection circuit of the test read control circuit selects any one of plural bits of test parity data that are read from the parity memory cells of the parity cell array according to an address, and outputs the selected bit to the external parity data terminals. A location of a regular memory cell and a parity memory cell, wherein data are read during the test mode, is switched to a location of a regular memory cell and a parity memory cell, wherein data are read during the normal operation mode, according to an address. Thus, data can be read from memory cells, which are relatively located at the same location, through a simple circuit.

In a semiconductor memory according to a preferred embodiment of the present invention, the regular cell arrays and the parity cell array are each composed of a plurality of segments. The total number of the segments of the regular cell arrays is the same as those of the external data terminals. The total number of the segments of the parity cell array is the same as the number of the external parity data terminals. The test read data selection circuit outputs the test data read from each of the segments of the regular cell arrays during the test mode to each of the external data terminals. The parity read data selection circuit outputs the test parity data read from each of the segments of the parity cell array during the test mode to each of the external parity data terminals.

Reading of data during the test mode is carried out on a segment basis in accordance with the array structure of a semiconductor memory. The test read data selection circuit could be therefore constructed using a plurality of sub-circuits wherein logic states are the same corresponding to segments. In the same manner, the parity read data selection circuit could be also constructed using a plurality of sub-circuits wherein logic states are the same corresponding to segments. Therefore, the logic designs of a test read data selection circuit and a parity read data selection circuit are facilitated.

In a semiconductor memory according to a preferred embodiment of the present invention, a plurality of data lines are connected to the segments of the regular cell arrays, respectively. A test read address decoder and a read data output circuit of the test read data selection circuit are formed every segment. The test read address decoder activates any one of the plurality of read decode signals according to an address. The read data output circuit outputs any one of the plural bits of the test data read by the data lines to the external data terminals according to the read decode signals. Accordingly, a test read address decoder and a read data output circuit, which correspond to one segment, can be applied to test read address decoders and read data output circuits, which correspond to a plurality of different segments. It is thus possible to reduce a logic design period and a design verify period.

In a semiconductor memory according to a preferred embodiment of the present invention, an output circuit of the test write data selection circuit has its output terminals set to a high impedance state during the normal operation mode. An output circuit of the normal write data selection circuit has its output terminals set to a high impedance state during the test mode. Therefore, during the normal operation mode and the test mode, the output of the test write data selection circuit and the output of the normal write data selection circuit can be prevented from colliding against each other. Since collision can be prevented, data lines, which are wired from the test write data selection circuit and the normal write data selection circuit to the regular cell arrays, can be used commonly.

In a semiconductor memory according to a preferred embodiment of the present invention, an output circuit of the test read data selection circuit has its output terminals set to a high impedance state during the normal operation mode. An output circuit of the normal read data selection circuit has its output terminals set to a high impedance state during the test mode. Therefore, during the normal operation mode and the test mode, the output of the test read data selection circuit and the output of the normal read data selection circuit can be prevented from colliding against each other. Since collision can be prevented, data lines, which are wired from the test read data selection circuit and the normal read data selection circuit to the external data terminals, can be used commonly.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
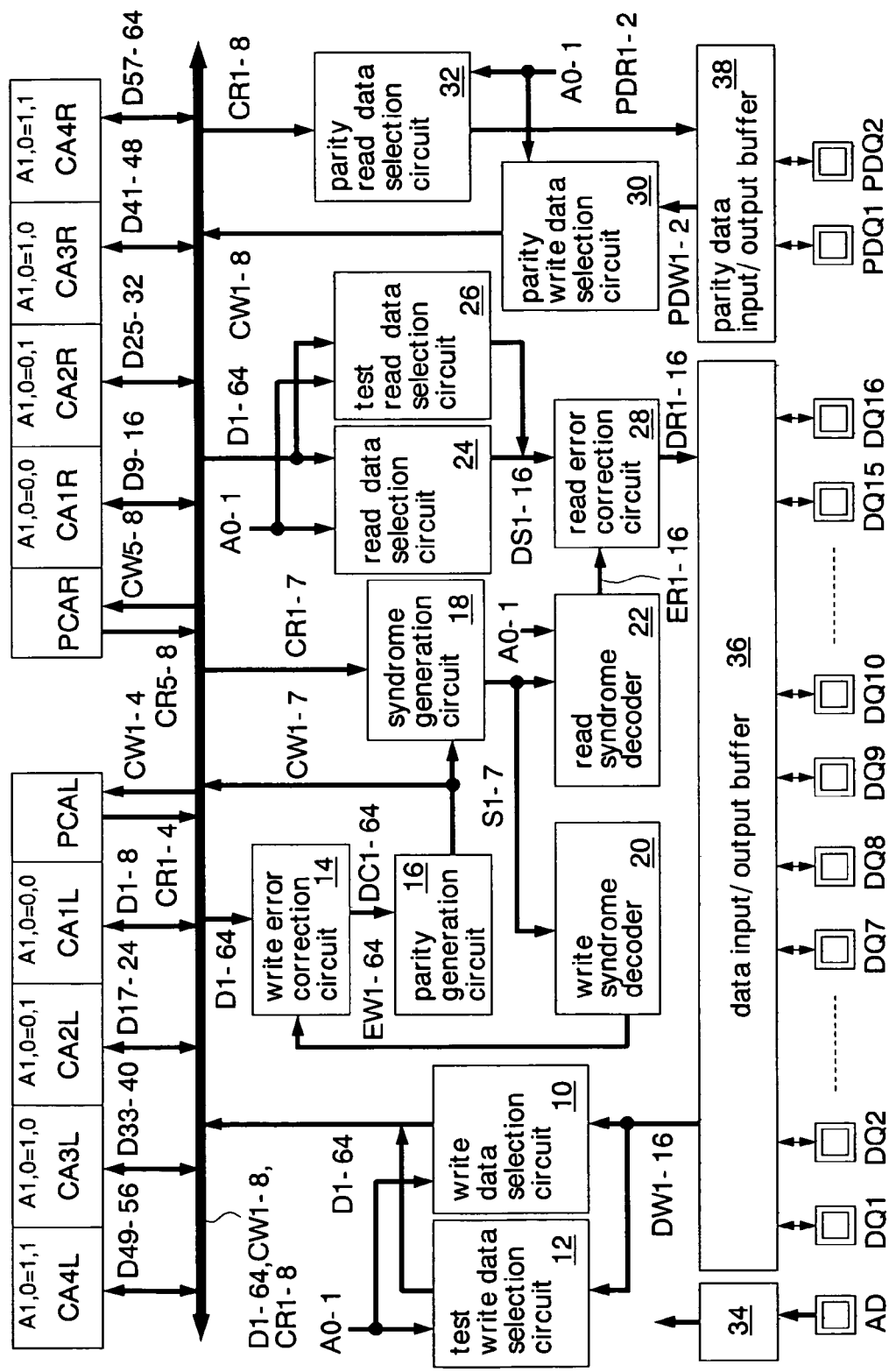
FIG. 1 is a block diagram illustrating a semiconductor memory according to a first embodiment of the present invention.

Embodiments according to the present invention will be described with reference to the accompanying drawings. Squares in the drawings indicate external data terminals (pads). Signal lines indicated by a bold line in the drawings are in plural. Further, some of blocks connected to bold lines include a plurality of circuits. Signals supplied through the external data terminals are assigned with the same reference numerals as those of the terminal names. Moreover, the signal lines through which the signals are transferred are assigned with the same reference numerals as those of the signals.

FIG. 1 is a block diagram illustrating a semiconductor memory according to a first embodiment of the present invention. The semiconductor memory can be a pseudo SRAM, which is formed on a silicon substrate by means of a CMOS process. The pseudo SRAM includes a memory core of a DRAM and the interface of a SRAM.

The pseudo SRAM includes regular cell arrays CA1 (CA1L, CA1R), CA2 (CA2L, CA2R), CA3 (CA3L, CA3R) and CA4 (CA4L, CA4R) for storing data received through external data terminals DQ1-16, a parity cell array PCA (PCAL, PCAR) for storing parity data, a write data selection circuit 10, a test write data selection circuit 12, a write error correction circuit 14, a parity generation circuit 16, a syndrome generation circuit 18, a write syndrome decoder 20, a read syndrome decoder 22, a read data selection circuit 24, a test read data selection circuit 26, a read error correction circuit 28, a parity write data selection circuit 30, a parity read data selection circuit 32, an address buffer 34, a data I/O buffer 36, and a parity data I/O buffer 38.

The pseudo SRAM further includes an address decoder, a command terminal and a command buffer for receiving operational commands (write command, read command, etc.), a command decoder for decoding the operation commands, an operation control circuit for generating a control signal to control the write operation, the read operation and the refresh operation for the cell arrays CA1-4 and PCA, a test control circuit that switches the pseudo SRAM from normal operation mode to test mode according to the test command supplied via the command terminal, and the like. The test control circuit maintains a test signal TES, which will be described later, at a high level in the test mode, and maintains it at a low level in the normal operation mode.

The regular cell arrays CA1L, CA2L, CA3L and CA4L shown on the left side of FIG. 1 serve to store data provided to the external data terminals DQ1-8. The regular cell arrays CA1R, CA2R, CA3R and CA4R shown on the right side of FIG. 1 serve to store data supplied to the external data terminals DQ9-16. The external data terminals DQ1-16 are sequentially disposed from the left side to the right side, as shown in FIG. 1. A bit width of data of each of the regular cell arrays CA1L-CA4L and CA1R-CA4R is 8 bits, which are the same as those of corresponding external data terminals DQ1-8 and DQ9-16. As such, if the regular cell array CA1 (CA2-4) is disposed with it being divided into the two regular cell arrays CA1L and CA1R (CA2L and CA2R, CA3L and CA3R, CA4L and CA4R) each corresponding to the external data terminals DQ1-8 and DQ9-16, data lines can be wired on the chip on a regular manner. The cell arrays will be later described in detail with reference to FIGS. 2 to 4.

Write data supplied to the external data terminals DQ1-8 (lower bytes) are stored in any one of the regular cell arrays CA1L-CA4L each having a letter "L" attached to their ends, according to addresses A1-0. Write data supplied to the external data terminals DQ9-16 (upper bytes) are stored in any one of the regular cell arrays CA1R-CA4R each having a letter "R" attached to their ends, according to the addresses A1-0.

In normal operation mode, the regular cell array CA1 is accessed when the least significant two bits (A1, A0) of an address are (O, O). Similarly, the regular cell arrays CA2-4 are accessed when the addresses A1, A0 are (0, 1), (1, 0) and (1, 1). At this time, the normal operation mode is an operating mode for enabling a system (user) mounted with the pseudo SRAM to have access to a pseudo SRAM. Write data provided to the external data terminals DQ1-16 are written into any one of the regular cell arrays CA1-4, which is selected according to the addresses A1-0 every write operation. Further, 16 bits, which are selected according to the addresses A1-0 from 64-bit data read from the regular cell arrays CA1-4 every read operation, are output to the external data terminals DQ1-16.

The parity cell array PCA stores 7-bit parity bits (parity data) corresponding to the 64-bit data stored in the regular cell arrays CA1-4. Write parity data CW1-7 written into the parity cell array PCA are generated by the parity generation circuit 16. Read parity data CR1-7 read from the parity cell array PCA are output to the syndrome generation circuit 18.

The lower 4 bits (CW1-4 or CR1-4) among the parity bits are stored in the parity cell array PCAL on the left side of FIG. 1. The upper 3 bits (CW5-7 or CR5-7) among the parity bits are stored in the parity cell array PCAR on the right side of the drawing.

Although the parity bits are 7 bits, the bit width of the parity cell array PCA can be designed to be 8 bits so that the layout of the parity cell array PCA and the layout of the regular cell arrays CA1-4 are the same. Furthermore, considering the ease of the test (evaluation) to be described later, 8-bit signal lines can be wired so as to have access to all bits including the most significant bit CW8 (=CR8). In the present embodiment, although the write parity data lines CW1-8 for the input and the read parity data lines CR1-8 for the output are independently wired, a common signal line for both the input and output can be wired.

The write data selection circuit 10 (normal write data selection circuit) is activated during the normal operation mode, and inactivated during the test mode, according to the test signal TES output from the test control circuit. The write data selection circuit 10 outputs the write data DW1-16, which are received through the external data terminals DQ1-16, to any one of the data lines D1-16, D17-32, D33-48 and D48-64 according to the addresses A1-0, during the write operation of the normal operation mode. The write data selection circuit 10 includes an output circuit (not shown) that has its output terminals D1-64 set to a high impedance state during the test mode (test signal TES=high level). The output circuit can include a circuit such as an output circuit 12d shown in FIG. 7, which will be described later.

The test write data selection circuit 12 is inactivated during the normal operation mode and activated during the test mode, according to the test signal TES output from the test control circuit. The test write data selection circuit 12 includes an output circuit (the output circuit 12d shown in FIG. 7) that has its output terminals D1-64 set to a high impedance state during the normal operation mode (test signal TES=low level). The test write data selection circuit 12 outputs the write data DW1-16, which are received through the external data terminals DQ1-16, to any one of the data lines D1-64 according to the addresses A1-0 during the write operation of the test mode.

Figure 9:
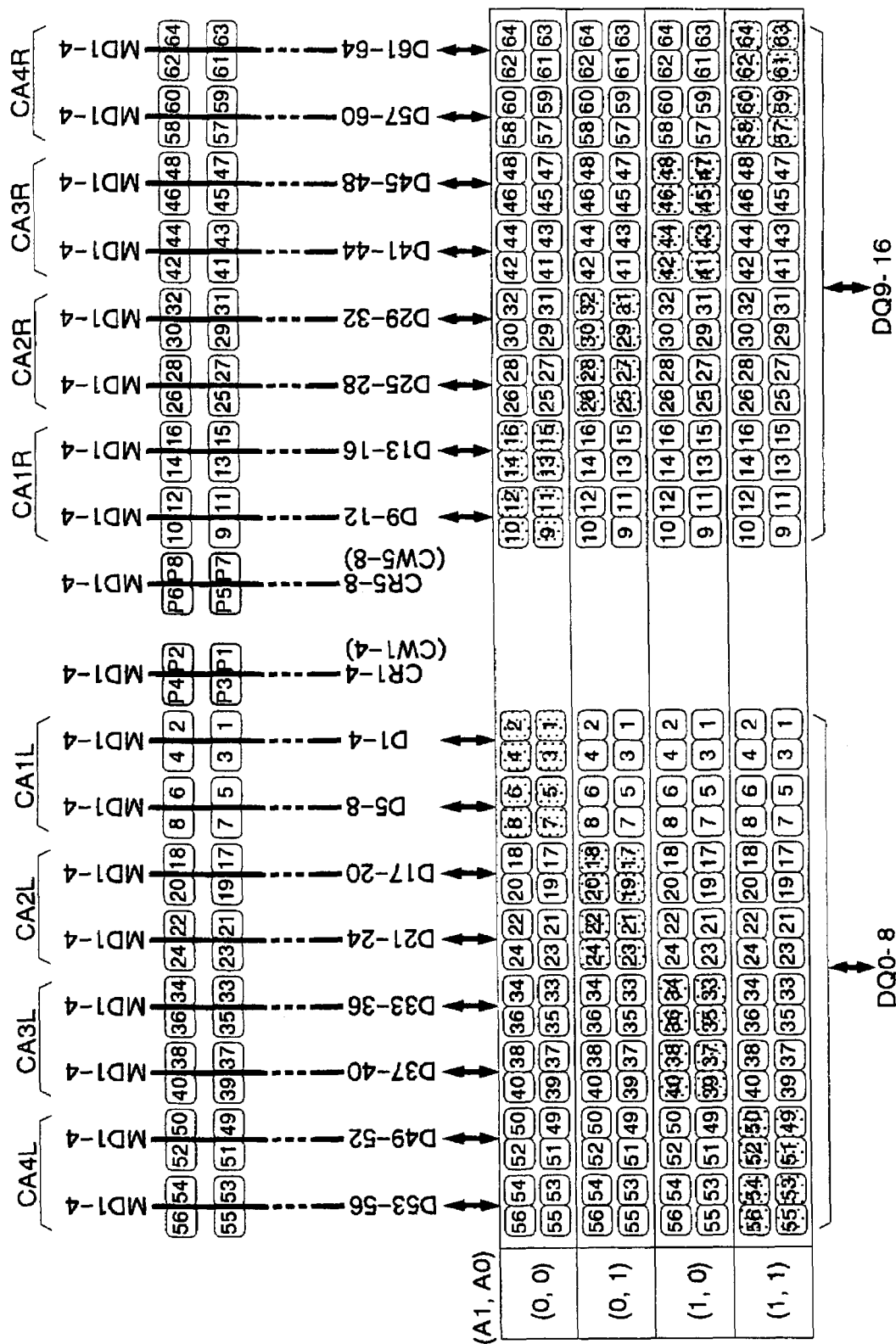
FIG. 9 is an explanatory diagram illustrating the outline of the read operation and the write operation in the normal operation mode.
Figure 10:
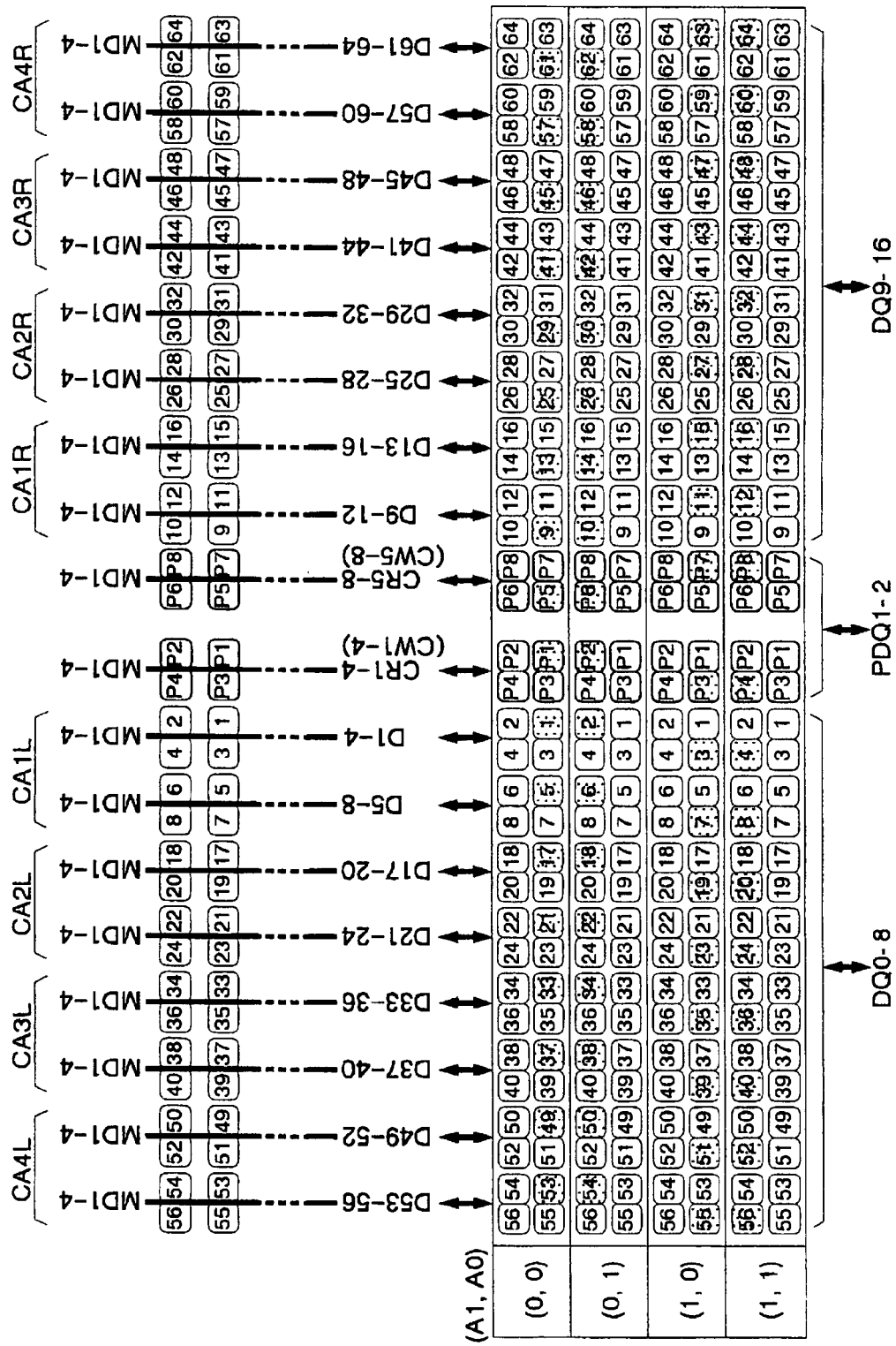
FIG. 10 is an explanatory diagram illustrating the outline of the read operation and the write operation in the test mode.

As such, the write data DW1-16 are distributed to the data line D by means of the write data selection circuit 10 during the normal operation mode, and are distributed to the data line D by means of the test write data selection circuit 12 during the test mode. Any one of the output terminals D1-64 of the test write data selection circuit 12 and any one of the output terminals D1-64 of the write data selection circuit 10 are set to a high impedance state depending upon the operating mode. Therefore, during the normal operation mode and the test mode, the output data of the test write data selection circuit 12 and the output data of the write data selection circuit 10 can be prevented from colliding against each other. Since collision can be prevented, the data lines D1-64, which are wired from the test write data selection circuit 12 and the normal write data selection circuit 10 to the regular cell arrays CA1-4, can be made common. It is therefore possible to prevent an increase in the chip size of the pseudo SRAM. In addition, 16 bits, which are selected by the write data selection circuit 10 according to the addresses A1-0, and 16 bits, which are selected by the test write data selection circuit 12 according to the addresses A1-0, are different from each other, as shown in FIGS. 9 and 10 to be described later. The details of the test write data selection circuit 12 will be described with reference to FIGS. 7 and 8.

The write error correction circuit 14 outputs the data D1-64 read from the regular cell arrays CA1-4 as correction data DC1-64 intact in the read operation in response to a read request from the outside. The write error correction circuit 14 performs an error correction operation on the data D1-64 that are read from the regular cell arrays CA1-4 based on bit values of write error detection data EW1-64 in the write operation in response to the write request from the outside. The write error correction circuit 14 includes an inversion circuit (not shown) for inverting a logic state of an error bit designated by the write syndrome decoder 20 for error correction. The inversion circuit can be composed of, for example, an EOR (Exclusive NOR) circuit. The write error correction circuit 14 outputs the bit data (1 bit of DC1-64), which is corrected through the inversion circuit, to the parity generation circuit 16 along with other bit data (the remaining bits of DC1-64, which are not corrected) supplied to the external data terminals DQ1-16. In addition, reading of the data D1-64 from the regular cell arrays CA1-4 in the write operation is required so as to store the parity data of the 64-bit data that are written into the regular cell arrays CA1-4 in the parity cell array PCA.

The write error correction circuit 14 further includes a latch circuit (not shown) for holding read data including bit data designated by the write syndrome decoder 20. Therefore, there is no need to synchronize the timing of the write data supplied through the external data terminals DQ1-16 and the timing of the read data read from the regular cell arrays CA1-4 in response to a write request. Accordingly, parity data can be surely generated using the write data and the read data that are held in latch circuit. Resultantly, timing design can be facilitated. It is also possible to set a timing specification to be user-friendly. Moreover, even when write data each written into the regular cell arrays CA1-4 in the write operation are sequentially supplied to the external data terminals DQ1-16 (burst write operation, etc.), they can be certainly held by the latch circuit.

The parity generation circuit 16 is activated during the normal operation mode and inactivated during the test mode, according to the test signal TES output from the test control circuit. The parity generation circuit 16 generates the write parity data CW1-7 using the correction data DC1-64. The parity generation circuit 16 includes an output circuit (not shown) that has its output terminals CW1-7 set to a high impedance state during the test operation mode. The output circuit includes a circuit such as an output circuit 26d shown in FIG. 5, which will be described later, every output terminals CW1-7. The output circuit can set the output terminals CW1-7 to a high impedance state when the test signal TES is at a high level.

The syndrome generation circuit 18 performs an XOR operation on the write parity data CW1-7 and the read parity data CR1-7, thus generating syndromes S1-7. The write syndrome decoder 20 designates bits where failure has occurred according to the syndromes S1-7 in order to carry out the error correction operation on the data D1-64 that are read from the regular cell arrays CA1-4 at the start of a write cycle, which begins in response to a write request. The write syndrome decoder 20 sets bits (for example, EW1) of the write error detection data EW, which correspond to bits where failure has occurred, to a logic level different from that of other bits (for example, EW2-64).

The read syndrome decoder 22 determines whether bit failure exists in 16-bit read data that are output to the external data terminals DQ1-16 according to the syndromes S1-7 and the read addresses A1-0 in the read operation. That is, the read syndrome decoder 22 designates the external data terminal DQ (any one of DQ1-16) corresponding to bit data where failure has occurred, according to the syndromes S1-7 and the read addresses A1-0.

The read syndrome decoder 22 sets bits (for example, ER7) of the read error detection data ER, which correspond to bit data where failure has occurred, to a logic level different from that of other bits (for example, ER1-6, ER8-16).

The read data selection circuit 24 (normal read data selection circuit) is activated during the normal operation mode and inactivated during the test mode, according to the test signal TES output from the test control circuit. The read data selection circuit 24 outputs 16 bits of the read data D1-64 that are read from the regular cell arrays CA1-4, which are selected according to the addresses A1-0, as select data DS1-16 in the read operation of the normal operation mode, and then outputs the 16 bits to the external data terminals DQ1-16. The read data selection circuit 24 includes an output circuit (not shown) that has its output terminals DS1-16 set to a high impedance state during the test mode. The output circuit can be a circuit such as the output circuit 26d shown in FIG. 5 that will be described later.

The test read data selection circuit 26 is inactivated during the normal operation mode and activated during the test mode, according to the test signal TES output from the test control circuit. The test read data selection circuit 26 includes an output circuit (the output circuit 26d shown in FIG. 5) that has its output terminals DS1-16 set to a high impedance state during the normal operation mode. The test read data selection circuit 26 outputs 16 bits of the read data D1-64 read from the regular cell arrays CA1-4, which are selected according to the addresses A1-0, as the select data DS1-16 in the read operation of the test mode, and outputs the 16 bits to the external data terminals DQ1-16.

As such, the 16 bits are selected from the read data D1-64 by means of the read data selection circuit 24 during the normal operation mode, and by means of the test read data selection circuit 26 during the test mode. Any one of the output terminals DS1-16 of the test read data selection circuit 26 and any one of the output terminals DS1-16 of the read data selection circuit 24 are set to a high impedance state depending upon the operating mode. Therefore, during the normal operation mode and the test mode, the output data from the test read data selection circuit 26 and the output data from the read data selection circuit 24 can be prevented from colliding against each other. Since collision can be prevented, the selected data lines DS1-16, which are wired from the test read data selection circuit 26 and the read data selection circuit 24 to the read error correction circuit 28, can be made common. It is thus possible to prevent an increase in the chip size of a pseudo SRAM. In addition, 16 bits, which are selected by the read data selection circuit 24 according to the addresses A1-0, and 16 bits, which are selected by the test read data selection circuit 26 according to the addresses A1-0, are different from each other, as shown in FIGS. 9 and 10 to be described later. Detailed description on the test read data selection circuit 26 will be given with reference to FIGS. 5 and 6 to be described later.

The read error correction circuit 28 includes an inversion circuit (not shown) for inverting a logic state of bit data corresponding to the data terminal DQ (any one of DQ1-16), which is designated by the read syndrome decoder 22, for error correction. For example, the inversion circuit can be composed of an EOR circuit, etc. The read error correction circuit 28 performs an error correction operation by inverting 1 bit of the select data DS1-16 through the inversion circuit, according to the read error detection data ER1-16, and then outputs the error corrected data as the read data DR1-16.

The parity write data selection circuit 30 is inactivated during the normal operation mode and activated during the test mode, according to the test signal TES output from the test control circuit. The parity write data selection circuit 30 receives test write parity data PWD1-2 through the external parity data terminals PDQ1-2, and outputs the received data PWD1-2 to any one of the write parity data lines CW1, 5, CW2, 6, CW3, 7, CW4, 8 in the write operation of the test mode according to the addresses A1-0. The parity write data selection circuit 30 includes an output circuit (not shown) that has its the output terminals CW1-8 to a high impedance state during the normal operation mode. The output circuit includes a circuit such as the output circuit 26d shown in FIG. 5, which will be described later, every output terminals CW1-8. The output circuit sets the output terminals CW1-8 to a high impedance state when the test signal TES is at a low level. The test write data selection circuit 12 and the parity write data selection circuit 30 operate during the test mode, and thus serve as a test write control circuit for writing test data into a regular memory cell at a location corresponding to that of a parity memory cell into which test parity data are written, in each of the regular cell arrays CA1-4. In this case, the parity memory cell is a memory cell that constitutes the parity cell array PCA. The regular memory cell is a memory cell that constitutes the regular cell arrays CA1-4.

The parity read data selection circuit 32 is inactivated during the normal operation mode and activated during the test mode, according to the test signal TES output from the test control circuit. The parity read data selection circuit 32 selects 2 bits from the read parity data CR1-8 that are read from the parity cell array PCA according to the addresses A1-0 in the read operation of the test mode, and outputs the selected data (any one of CR1, 5, CR2, 6, CR3, 7, CR4, 8) as read parity data PDR1-2. The test read data selection circuit 26 and the parity read data selection circuit 32 serve as a test read control circuit for reading test data from a regular memory cell at a location corresponding to that of a parity memory cell from which test parity data are read during the test mode, in each of the regular cell arrays CA1-4.

The address buffer 34 receives an address for selecting a memory cell where data are read and written through an address terminal AD. The address consists of a row address (upper bits) for selecting a row block RBLK to be described later and a word line WL within the row block RBLK, and a column address (lower bits) for selecting the regular cell arrays CA1-4 and bit lines BL, /BL within the cell arrays CA1-4. The data I/O buffer 36 outputs data that are supplied to the external data terminals DQ1-16 as the write data DW1-16, in the write operation. The data I/O buffer 36 outputs the 16-bit read data DR1-16 to the external data terminals DQ1-16 during the read operation.

The parity data I/O buffer 38 is inactivated during the normal operation mode and activated during the test mode, according to the test signal TES output from the test control circuit. The parity data I/O buffer 38 outputs the test parity data supplied to the external parity data terminals PDQ1-2 as the write parity data PDW1-2 in the write operation of the test mode. The parity data I/O buffer 38 outputs the read parity data PDR1-2 to the external parity data terminals PDQ1-2 during the read operation of the test mode.

Furthermore, the write error correction circuit 14, the parity generation circuit 16, the syndrome generation circuit 18, the write syndrome decoder 20 and the read syndrome decoder 22 are inactivated according to the test signal TES output from the test control circuit during the test mode. The read error correction circuit 28 has its error correction function masked under the control of the test control circuit during test mode. Accordingly, the read error correction circuit 28 outputs the select data DS1-16 as the correction data DR1-16 without error correction, during the test mode.

Figure 2:
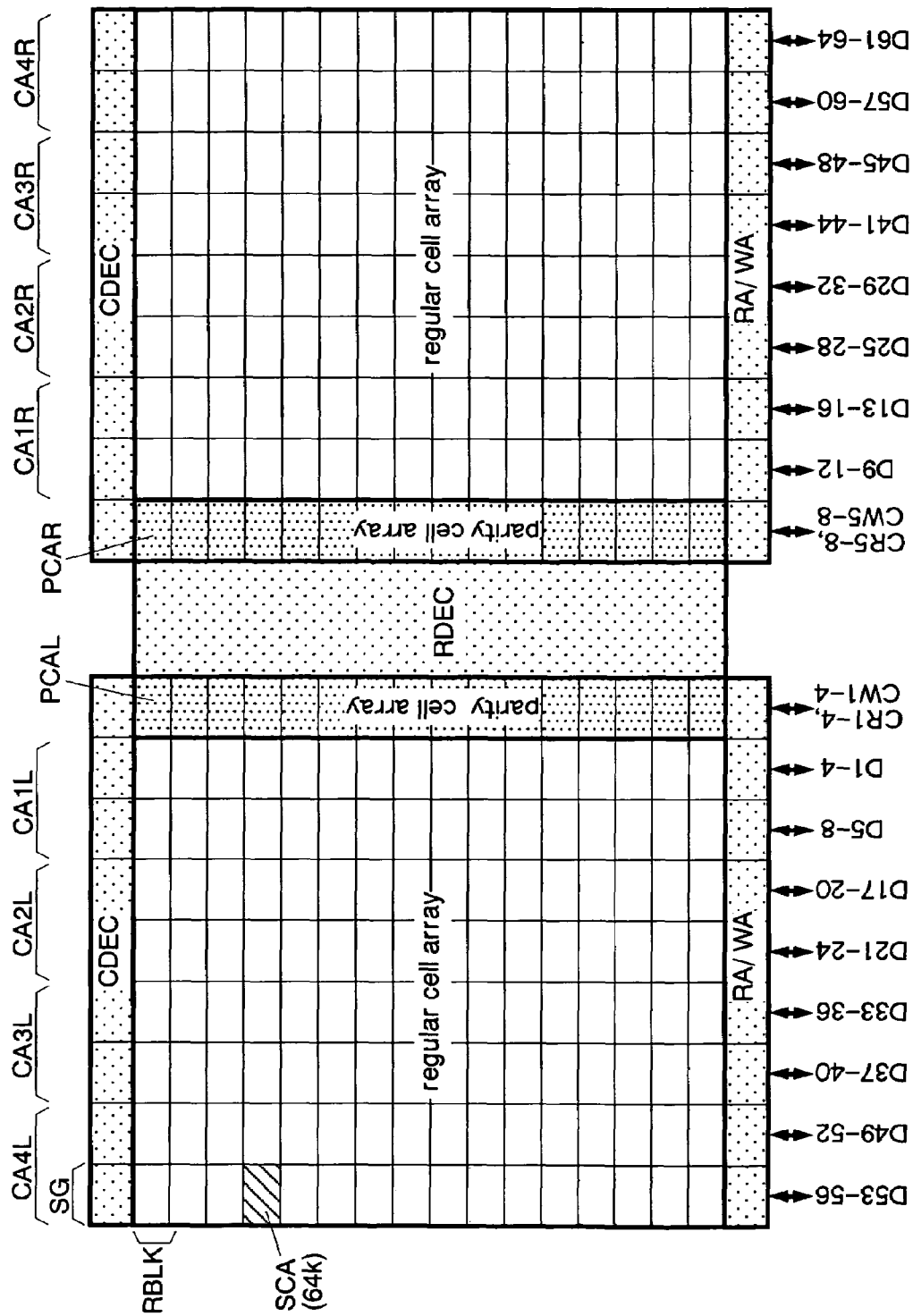
FIG. 2 is a layout diagram of a regular cell array and a parity cell array shown in FIG. 1.

FIG. 2 is a layout diagram of the regular cell arrays CA1-4 and the parity cell array PCA shown in FIG. 1. The regular cell arrays CA1-4 together generally have a 16 Mbit memory capacity, and the parity cell array PCA (PCAL, PCAR) generally has a 2 Mbit memory capacity. Each of the regular cell arrays CA1L-4L and CA1R-4R is composed of two segments SG having 1 Mbit memory capacity. The parity cell array PCA is composed of two segment SG corresponding to the parity cell arrays PCAL, PCAR. That is, the pseudo SRAM has 16 segments SG for the regular cell arrays CA1-4, and two segments SG for the parity cell array PCA. The number of the segments SG is the same as that of each of the external parity data terminals DQ1-16 and the parity data terminals PDQ1-2.

The 9 Mbit cell arrays CA1L-CA4L and PCAL disposed on the left side of FIG. 2 and the 9 Mbit cell arrays CA1R-CA4R and PCAR disposed on the right side of the drawing are respectively divided into 16 row blocks RBLK in a longitudinal direction of FIG. 2. In the read operation and the write operation, one of the row blocks RBLK is selected according to a row block select address (upper 4 bits of the row address AD). Sub-cell arrays SCA having a 64 Kbit memory cell are formed at regions where the row blocks RBLK extending in a horizontal direction and the segments SG extending in a longitudinal direction intersect (for example, regions indicated by an oblique line).

In FIG. 2, a column decoder CDEC, and a read amplifier RA and a write amplifier WA are each disposed at an upper side and a lower side of the cell arrays CA1L-CA4L, PCAL, PCAR and CA1R-CA4R. The row decoder RDEC is disposed between the cell arrays PCAL and PCAR. The column decoder CDEC generates a column select signal CSL (shown in FIG. 4) every segment SG, for selecting bit lines for data input and output according to the column address AD (lower bits). The read amplifier RA outputs read data, which are amplified by a sense amplifier SA shown in FIG. 4 that will be described later, to the data lines D1-64 and CR1-8. The write amplifier WA outputs the write data D1-64 and the parity write data CW1-8 to the sense amplifier SA and the bit lines. The row decoder RDEC selects a row block RBLK, and also selects one of 512 word lines WL0-512 (shown in FIG. 4 to be described later) of the selected row block RBLK, according to the row address AD.

Figure 3:
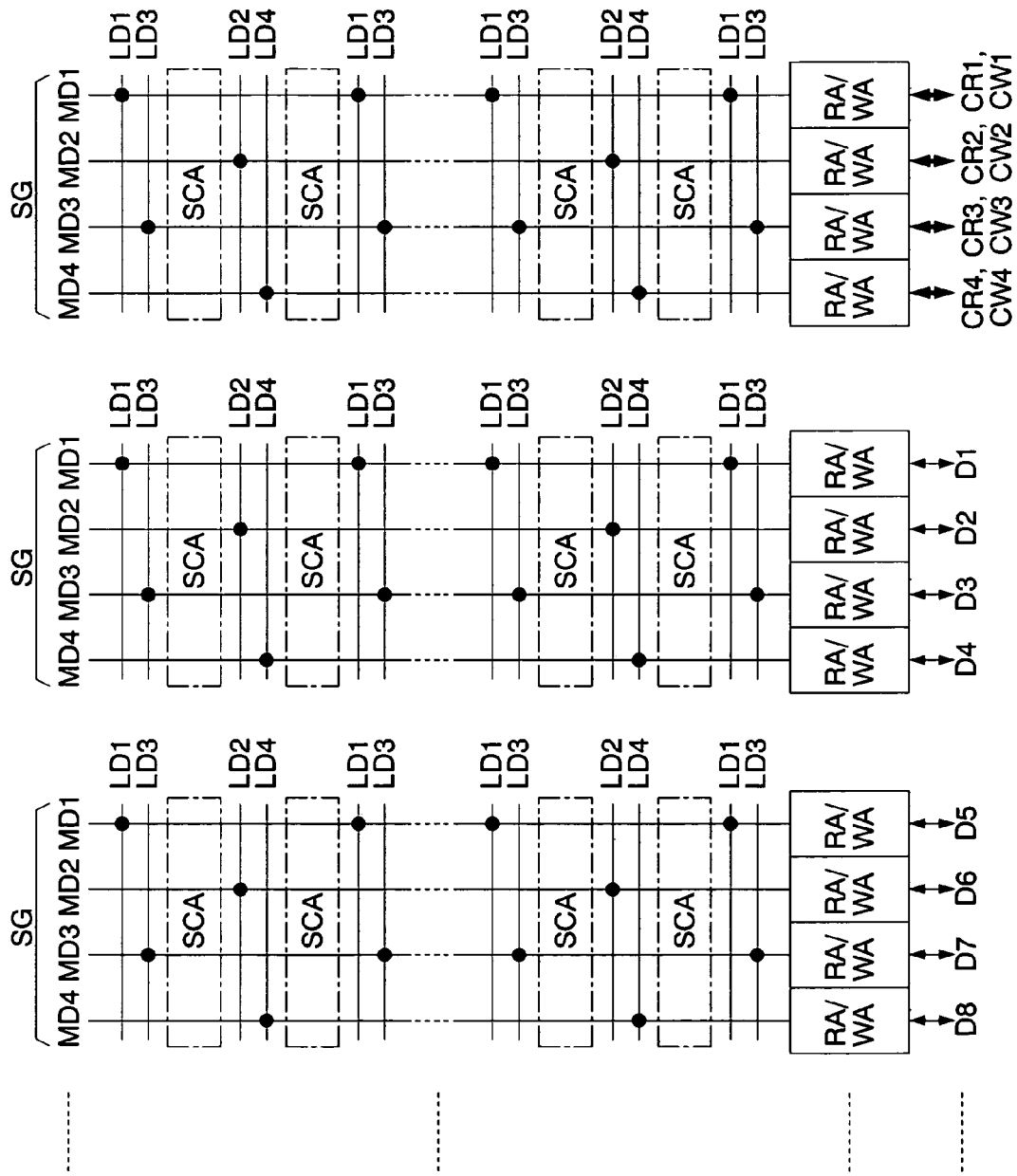
FIG. 3 is a detailed block diagram of segments shown in FIG. 2.

FIG. 3 is a detailed block diagram of the segments shown in FIG. 2. Each of the segments SG includes plural sets of local data lines LD1-4, which are wired in a horizontal direction of FIG. 3 along upper and lower sides of the sub-cell arrays SCA, main data lines MD1-4 respectively connected to the local data lines LD1-4, and four sets of read amplifiers RA/write amplifiers WA, which correspond to the main data lines MD1-4. The local data lines LD1-4 and the main data lines MD1-4 can be formed using a single line or a complementary line.

The sub-cell arrays SCA are each connected to the local data lines LD1-4 adjacent to the upper side or the lower side through the column switch CSW shown in FIG. 4 to be described later. In other words, the local data bus lines LD1 and LD3 and the local data lines LD2 and LD4 are shared by the sub-cell array SCA, which is adjacent to the lines at its upper and lower sides. The local data lines LD1 and LD3 at the top and bottom are, however, connected to a neighboring one sub-cell array SCA.

For example, in the read operation of the normal operation mode and the test mode, the columns of the sub-cell arrays SCA arranged in a horizontal direction of FIG. 3 according to the row address AD are selected, and 4-bit read data are output from each of the selected sub-cell arrays SCA to the local data lines LD1-4. The read data are transmitted to the main data lines MD1-4 through the local data lines LD1-4, and the signal amount of the read data is also amplified by the read amplifier RA. As such, 4-bit data are read every sub-cell array SCA. Accordingly, 64-bit regular data and 8-bit parity data can be read from the 16 sub-cell arrays SCA that constitute the regular cell arrays CA1-4 and the two sub-cell arrays SCA that constitute the parity cell array PCA through a single read operation.

In the write operation of the normal operation mode, the 64-bit data including the write data that are supplied through the external data terminals DQ1-16, and the write parity data CW1-8 of 64-bit data are written into the sub-cell arrays SCA on a four-bit basis. In addition, the most significant bit CW8 of the write parity data is dummy data that are not used in error correction, and is fixed to a logic 0 or logic 1. In the write operation of the test mode, 64-bit write data that are supplied with them being divided into four times through the external data terminals DQ1-16, and 8-bit test parity data that are supplied with them being divided into four times through the external test terminals PDQ1-2 are respectively written into selected sub-cell arrays SCA within the segment SG on a four-bit basis.

Figure 4:
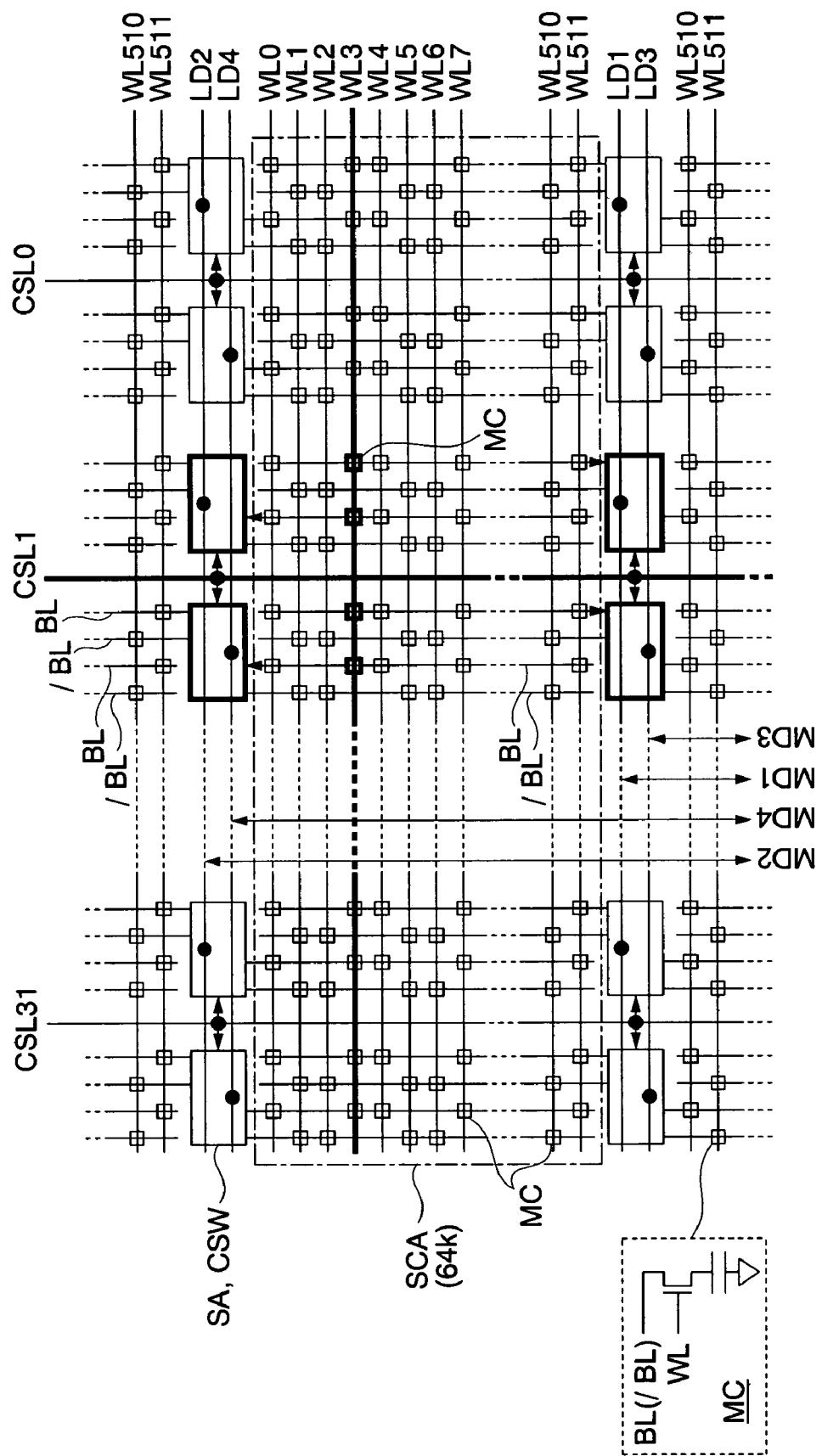
FIG. 4 is a detailed block diagram of sub-arrays shown in FIG. 3.

FIG. 4 is a detailed block diagram of the sub-arrays SCA shown in FIG. 3. The sub-cell array SCA includes 512 word lines WL0-511 that extend in a horizontal direction of FIG. 4, 256 bit lines (128 bit line pairs BL, /BL) that extend in a longitudinal direction of FIG. 4, and memory cells MC formed at the intersections of the word lines WL and the bit lines BL (or /BL). The memory cell MC can be a dynamic memory cell such as a DRAM memory cell. That is, the memory cell MC includes a capacitor for holding data as electric charges, and a transfer transistor for connecting the capacitor to the bit lines. The transfer transistor has source and drain one side and the other side of which are connected to the bit line BL (or /BL) and the capacitor, and gate connected to the word line WL.

Each of the bit line pairs BL, /BL is connected to any one of the local data lines LD1-4 through a column switch CSW (indicated by a black circle in FIG. 4) formed at an upper or lower side of the sub-cell array SCA. The column switch CSW is formed in a region where the sense amplifier SA is formed. The column switch CSW and the sense amplifier SA are shared by two sub-cell arrays SCA adjacent to each other. The column switch CSW and the sense amplifier SA are connected only to a sub-cell array SCA, which is selected according to a row address, by means of a switch transistor (bit line transmission gate) (not shown).

Column select lines CSL (CSL0-31) are wired along the bit line BL, /BL every four bit line pairs BL, /BL on the sub-cell array SCA. Each of the column selection lines CSL are connected to corresponding four column switches CSW. In the write operation and the read operation, a logic state of one of the column selection lines CSL0-31 shifts from a low level to a high level according to the column address AD (the column line selection address) in order to turn on the corresponding four column switches CSW. Data are written into the four bit lines BL, /BL from the local data lines LD1-4, or data are read by the local data lines LD1-4 from the four bit lines BL, /BL, through the turned-on column switches CSW.

For example, in the read operation, if the word line WL3 and the column selection line CSL1 that are indicated by bold lines in FIG. 4 are selected, data are read by the bit lines BL from the memory cells MC indicated by a bold line in the drawing, and a voltage difference between the bit lines BL, /BL is then amplified by the sense amplifiers SA indicated by a bold line. In order to facilitate understanding of the description, arrows are indicated in the bit lines BL from which data are read along the flow of the data. The amplified 4-bit read data are transmitted to the local data lines LD1-4 through the turned-on four column switches CSW according to the column selection line signal CSL1 of a high level, and are then transferred to the main data lines MD1-4. In addition, the main data lines MD1-4 that are commonly connected to the plural sets of the local data lines LD1-4 are formed using wiring layers of a layer higher than wiring layers that form the bit lines BL, /BL and the local data lines LD1-4.

Figure 5:
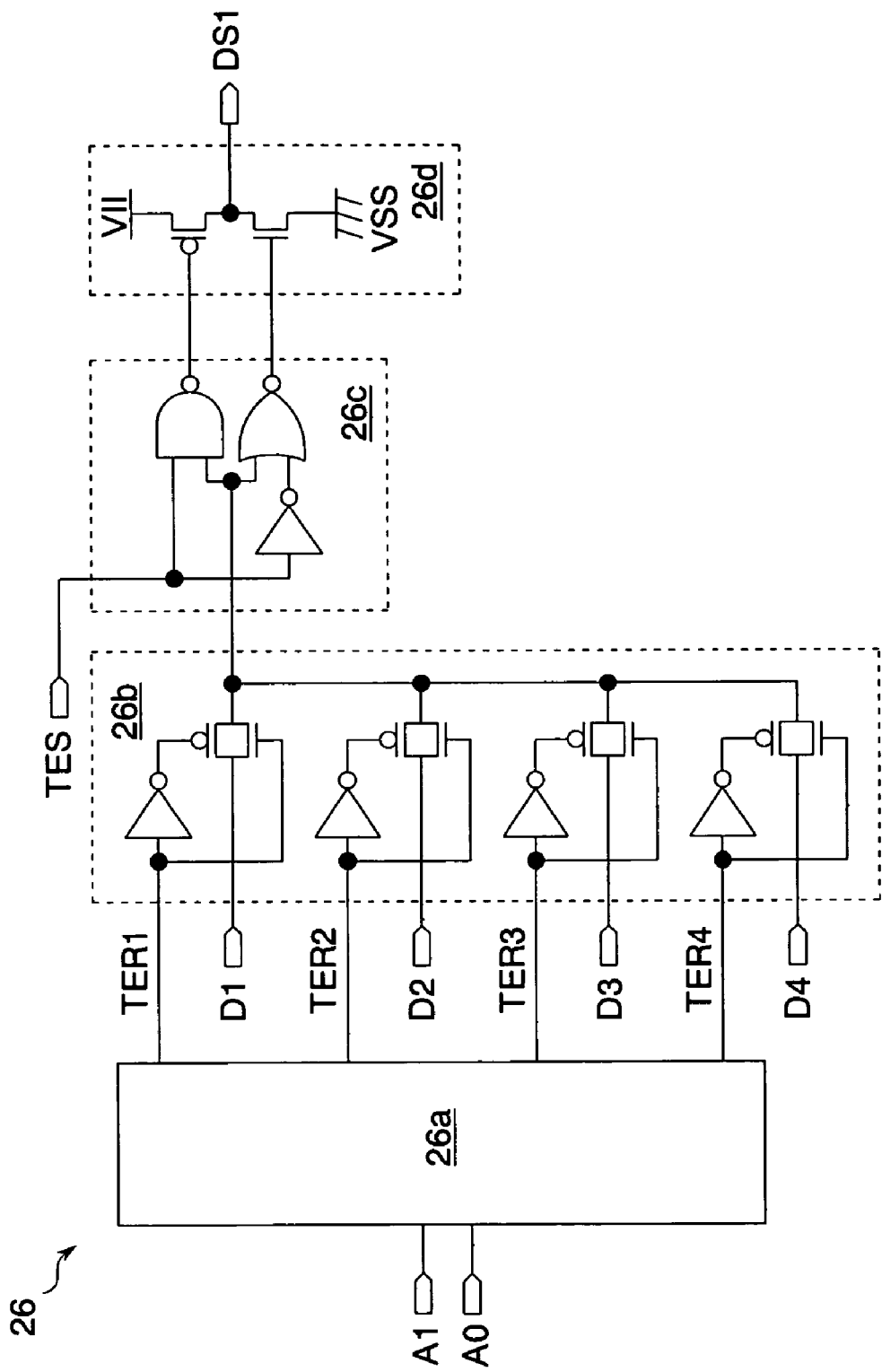
FIG. 5 is a detailed circuit diagram of a test read data selection circuit shown in FIG. 1.

FIG. 5 shows the details of main components of the test read data selection circuit 26 shown in FIG. 1. The test read data selection circuit 26 shown in FIG. 5 indicates a sub-circuit formed every segment SG. The test read data selection circuit 26 consists of 16 sub-circuits. In this example, the test read data selection circuit 26 indicates a sub-circuit corresponding to the segment SG on the right side of the regular cell array CA1L shown in FIG. 2. The test read data selection circuit 26 corresponding to each of the segments SG of the regular cell arrays CA1-4 is constructed by substituting the data D1-4 and the select data DS1 shown in FIG. 5 with the data D5-8 and DS2, D9-12 and DS3, D13-16 and DS4, D61-64 and DS16.

The test read data selection circuit 26 includes a test read address decoder 26a, a data selector 26b, an output control circuit 26c, and an output circuit 26d. The test read data selection circuit 26 is a kind of a parallel/serial conversion circuit. The test read address decoder 26a decodes addresses A1-0 so that any one of test read signals TER1-4 shifts from a low level to a high level. In the concrete, when the addresses A1-0 are "00", "01", "10" and "11", each of the test read signals TER1, TER2, TER3 and TER4 shifts to a high level. The data selector 26b includes four CMOS transmission gates each corresponding to data D1-4. The data selector 26b outputs one of the data D1-4 to the output control circuit 26c according to the test read signals TER1-4.

The output control circuit 26c outputs an inverted logic level of a logic level of the data that are supplied from the data selector 26b, through an NAND gate and a NOR gate during the test mode (test signal TES=high level). The output control circuit 26c sets the outputs of the NAND gate and the NOR gate to a high level and a low level during the normal operation mode (test signal TES=low level). The output circuit 26d has a PMOS transistor and an nMOS transistor serially connected between a power supply line VII and a ground line VSS. The output circuit 26d outputs the data received from the data selector 26b to the external data terminal DQ1 as the select data DS1 during the test mode. The output circuit 26d sets the select data line DS1 to a floating state, by turning off the pMOS transistor and the nMOS transistor under the control of the output control circuit 26c during the normal operation mode. As such, the data selector 26b, the output control circuit 26c and the output circuit 26d serve as a read data output circuit for outputting any one of the 4-bit test data, which are read by the data lines D1-4 (or D5-8, D9-12, D13-16, . . . , D61-64), to the external data terminal DQ1 (or DQ2-16) according to the read decode signals TER1-4.

Figure 6:
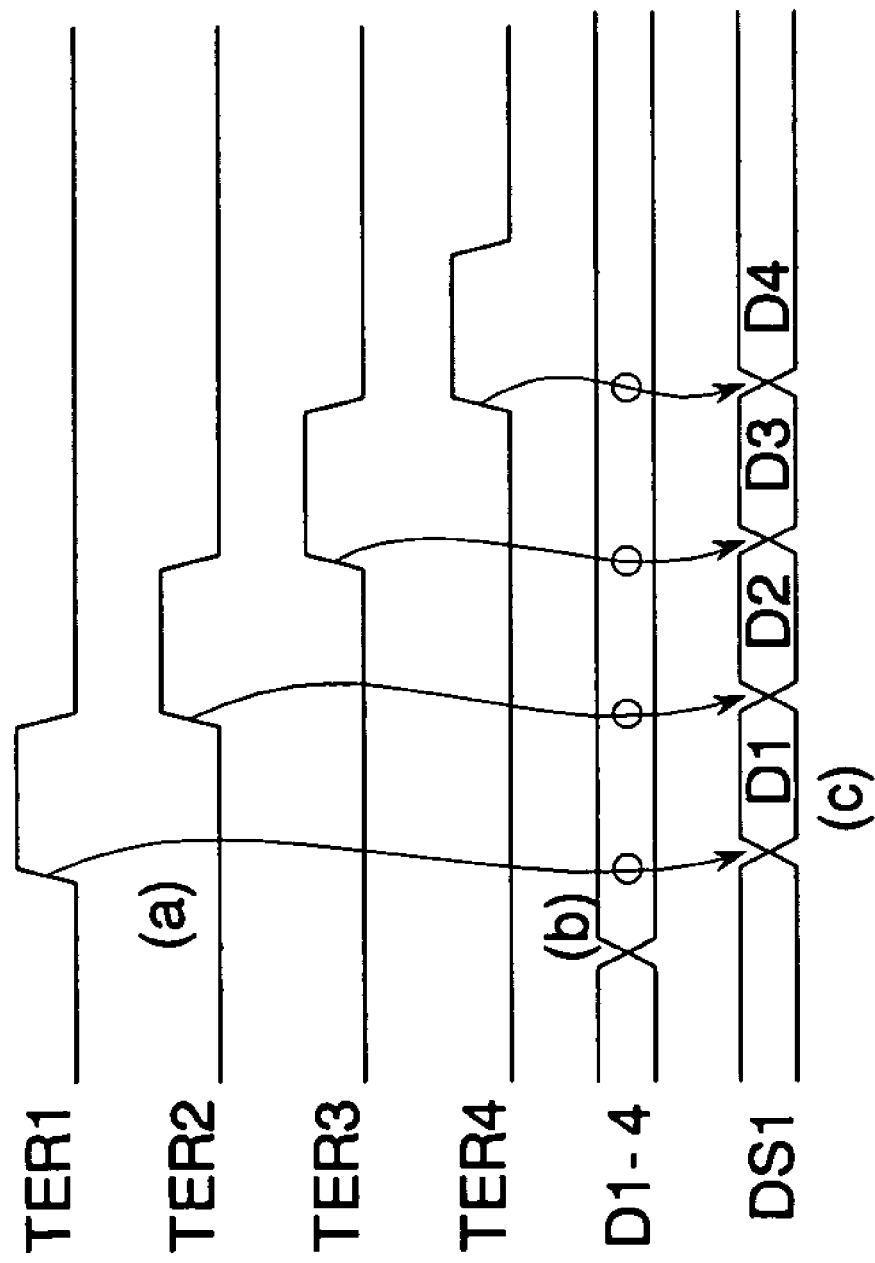
FIG. 6 is a timing diagram for explaining the operation of the test read data selection circuit shown in FIG. 5.

FIG. 6 illustrates the operation of the test read data selection circuit 26 shown in FIG. 5. In the present embodiment, during the test mode, addresses A1-0 of "00", "01", "10" and "11" are sequentially provided to a pseudo SRAM by means of a LSI tester for testing a pseudo SRAM, etc. The test read address decoder 26a sequentially generates the test read signals TER1-4 (pulse signals) according to the addresses A1-0 (FIG. 6(a)). The test read signals TER1-4 are generated without high-level periods being overlapped. The data selector 26b sequentially selects data D1-4 during the high-level periods of the test read signals TER1-4 (FIG. 6(b)). Further, the selected data D1-4 are output as select data DS1 (FIG. 6(c)). The test read data selection circuit 26 corresponding to the data D5-8, D9-12, . . . , D61-64 operate in the same manner as that described above.

Figure 7:
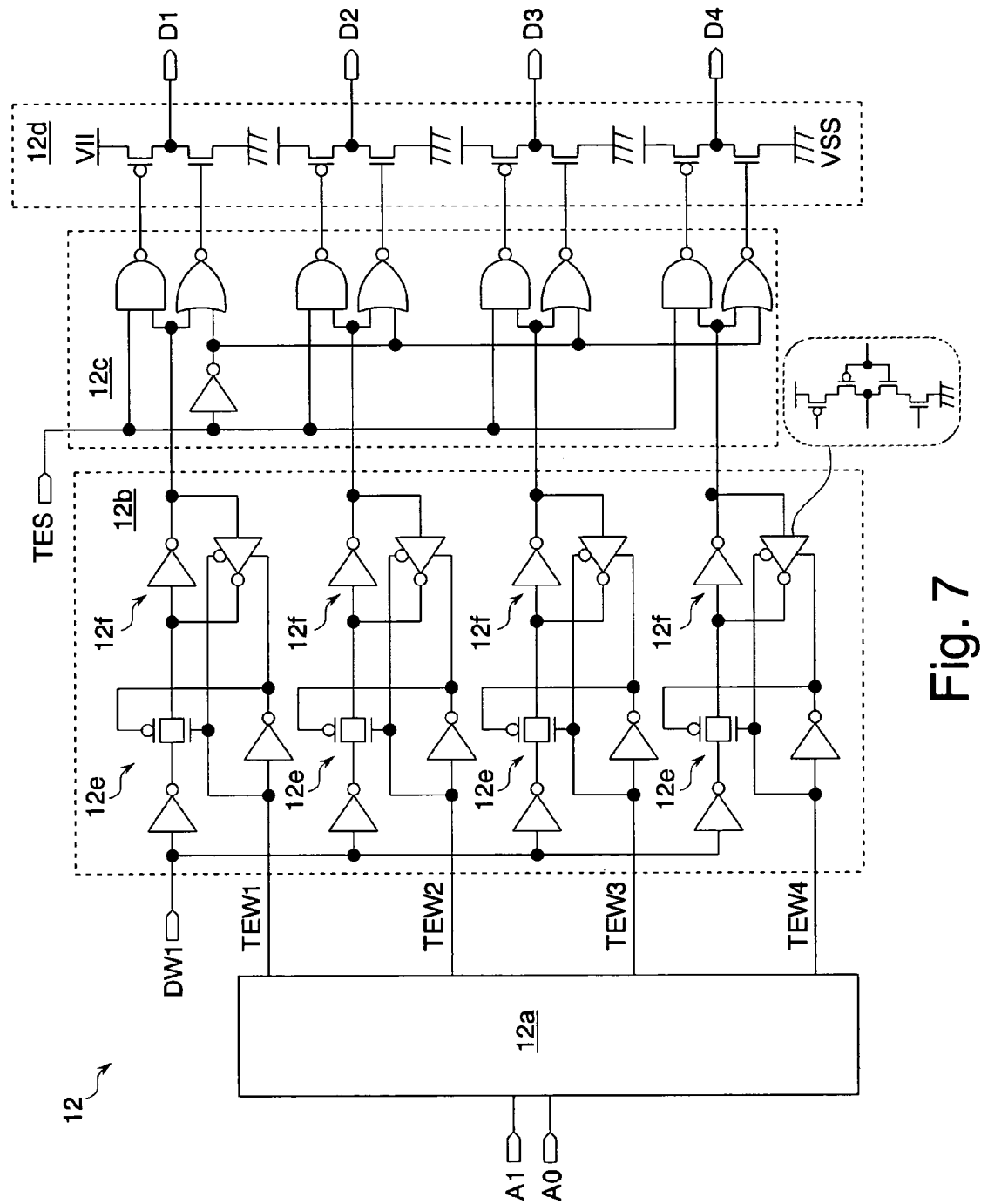
FIG. 7 is a detailed circuit diagram of a test write data selection circuit shown in FIG. 1.

FIG. 7 shows the details of main components of the test write data selection circuit 12 shown in FIG. 1. The test write data selection circuit 12 shown in FIG. 7 indicates a sub-circuit formed every segment SG. The test write data selection circuit 12 is composed of 16 sub-circuits. In this example, the test write data selection circuit 12 indicates the test write data selection circuit 12 corresponding to the segment SG on the right side of the regular cell array CA1L shown in FIG. 2. The test write data selection circuit 12 corresponding to each of the segments SG of the regular cell arrays CA1-4 is constructed by substituting the write data DW1 and the data D1-4 shown in FIG. 7 with data DW2 and D5-8, DW3 and D9-12, DW4 and D13-16, . . . , DW16 and D61-64.

The test write data selection circuit 12 includes a test write address decoder 12a, a data selector 12b, an output control circuit 12c and an output circuit 12d. The test write data selection circuit 12 is a kind of a serial/parallel conversion circuit. The test write address decoder 12a decodes addresses A1-0 so that any one of test write signals TEW1-4 shifts from a low level to a high level. In the concrete, when the addresses A1-0 are "00", "01", "10" and "11", each of the test write signals TEW1, TEW2, TEW3 and TEW4 shifts to a high level. The data selector 12b includes four CMOS transmission gates 12e and four latches 12f, which correspond to data D1-4, respectively. The CMOS transmission gates 12e are turned on when a corresponding test write signal TEW (any one of TEW1-4) is at a high level. In each of the latches 12f, the output and input of an inverter are connected to the input and output of a clocked inverter. The latch 12f transfers write data DW1 that are received from the CMOS transmission gate 12e to the output control circuit 12c when a corresponding test write signal TEW is at a low level. The latch 12f latches the write data DW1 that are received from the CMOS transmission gate 12e in synchronism with a falling edge of a corresponding test write signal TEW.

The output control circuit 12c includes a plurality of NAND gates and NOR gates corresponding to the data lines D1-4. The output control circuit 12c outputs an inverted logic signal of a logic level of the write data DW1, which are received from the data selector 12b, through the NAND gate and the NOR gate during the test mode (test signal TES=high level). The output control circuit 12c sets the outputs of the NAND gates and the NOR gates to a high level and a low level during the normal operation mode (test signal TES=low level). The output circuit 12d includes a plurality of PMOS transistors and nMOS transistors, which are serially connected between a power supply line VII and a ground line VSS corresponding to the data lines D1-4, respectively. At this time, a voltage of the power supply line VII is generated by an embedded internal voltage generating circuit using an external power source voltage VDD, and it is lower than the external power source voltage VDD. Each of the output circuits 12*d* outputs the write data DW1 that are received from the data selector 12*b* as the data D1 (or D2-4) during the test mode. The output circuits 12*d* set the data lines D1-4 to a floating state, by turning off the PMOS transistors and the nMOS transistors under the control of the output control circuits 12*c* during the normal operation mode. As such, the data selector 12*b*, the output control circuit 12*c* and the output circuit 12*d* serve as a write data output circuit, which outputs the test data DW1 (or DW2-16) to any one of the data lines D1-4 (or D5-8, D9-12, D13-16, . . . , D61-64) according to the write decode signals TEW1-4.

Figure 8:
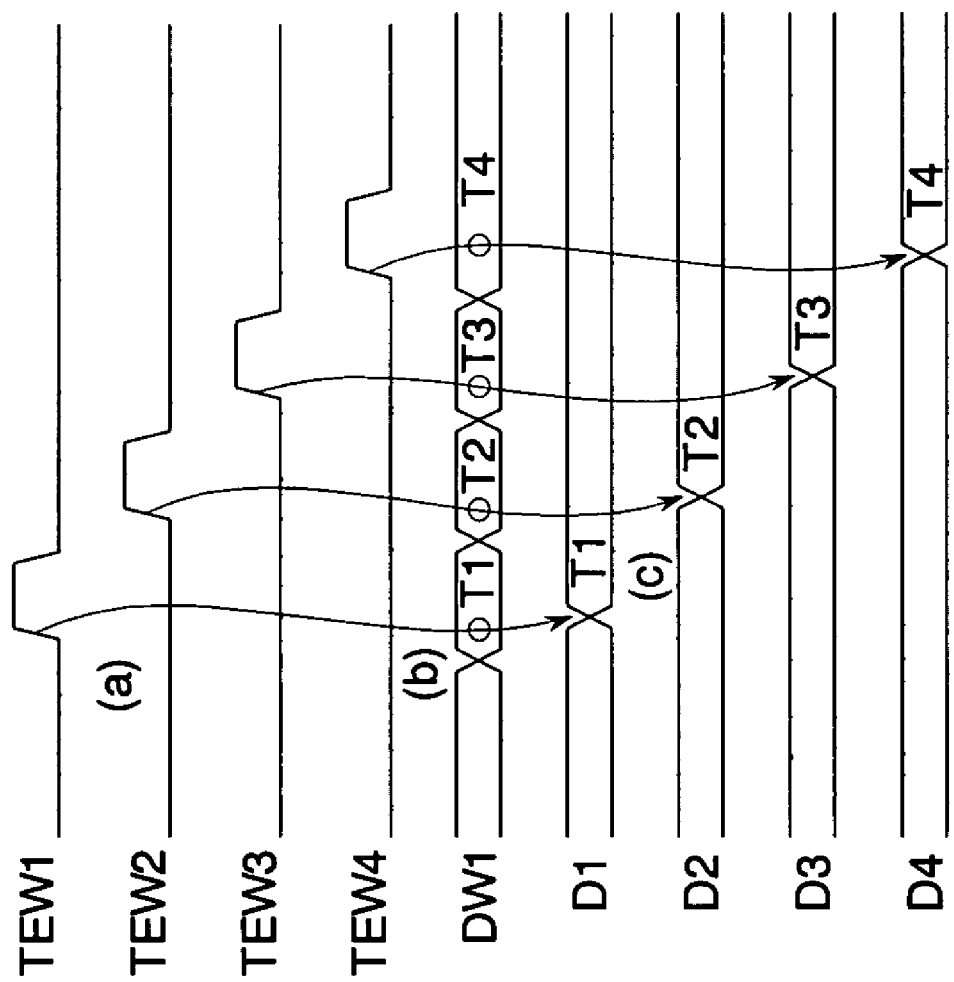
FIG. 8 is a timing diagram for explaining the operation of the test write data selection circuit shown in FIG. 7.

FIG. 8 shows the operation of the test write data selection circuit 12 shown in FIG. 7. In the present embodiment, during the test mode, addresses A1-0 of "00", "01", "10" and "11" are sequentially supplied to the pseudo SRAM by means of a LSI tester that tests a pseudo SRAM, etc. The test write address decoder 12*a* sequentially generates test write signals TEW1-4 (pulse signals) according to the addresses A1-0 (FIG. 8(*a*)). The test write signals TEW1-4 are generated without high-level periods being overlapped. The data selector 12*b* sequentially receives the test data DW1 (T1-T4) when the test write signals TEW1-4 are at a high level, and sequentially latches the received test data DW1 in synchronism with falling edges of the test write signals TEW1-4 (FIG. 8(*b*)). Further, the latched test data T1-T4 are output to the data lines D1-4 (FIG. 8(*c*)). The test write data selection circuit 12 corresponding to the data lines D5-8, D9-12, . . . , D61-64 operates in the same manner as that descried above.

Hereinafter, the read operation and the write operation of a pseudo SRAM in a normal operation mode will be described. If a read request (read command) is received, the pseudo SRAM reads the 16-bit data D1-16, D17-32, D33-48 and D49-64 from the regular cell arrays CA1-4, respectively, and thus reads the parity data CR1-7 from the parity cell array PCA. After the read data D1-64 experiences the write error correction circuit 14, the parity generation circuit 16 generates the parity data CW1-7. The syndrome generation circuit 18 compares the parity data CW1-7 and the parity data CR1-7 that are read from the parity cell array PCA, thus generating the syndromes S1-7.

Thereafter, the read syndrome decoder 22 generates the read error detection data ER1-16 according to the syndromes S1-7. The read data selection circuit 24 selects 16-bit read data that are output from a regular cell array CA (any one of CA1-4), which is selected according to the addresses A1-0 supplied along with the read command, and outputs the selected data as the select data DS1-16. The read error correction circuit 28 performs an error correction operation on bit data where failure has occurred according to the read error detection data ER1-16, and then outputs the error corrected data as the read data DR1-16. Further, the data I/O buffer 36 outputs the read data DR1-16 to the external data terminals DQ1-16. Thereby, the read operation is completed.

Meanwhile, if a write request (write command) is received, the pseudo SRAM reads the data D1-64 from the regular cell arrays CA1-4, and also the parity data CR1-7 from the parity cell array PCA, in the same manner as the read operation. The operation until when the syndromes S1-7 are generated by the syndrome generation circuit 18 is the same as that of the read operation. In the write operation, the syndrome decoder 20 for writing operates, and the syndromes S1-7 are thus decoded. The syndrome decoder 20 for writing generates the write error detection data signals EW1-64 according to the syndromes S1-7. The write error correction circuit 14 corrects bit failure of the read data D1-64 according to the write error detection data EW1-64.

If the error correction operation is finished, the data I/O buffer 36 outputs the write data DW1-16 that are received through the external data terminals DQ1-16 to the write data selection circuit 10. The write data selection circuit 10 transmits the received data to a regular cell array CA (any one of CA1-4), which is selected according to the addresses A1-0 supplied along with the write command. Furthermore, the 16-bit write data DW1-16 are written into any one of the regular cell arrays CA1-4. At this time, a write amplifier within the regular cell array CA into which data are written latches the write data DW1-16. Write amplifiers within the remaining three regular cell arrays CA into which data are not written continue to latch the data that have been firstly read.

The 64-bit data D1-64 in which the write data and the read data are combined are transmitted to the parity generation circuit 16 through the write error correction circuit 14 again. The parity generation circuit 16 then generates the parity data CW1-7. The generated parity data CW1-7 are written into the parity cell array PCA. The write operation is thereby completed.

Moreover, in the test mode, the test write data selection circuit 12 and the test read data selection circuit 26 operate instead of the write data selection circuit 10 and the read data selection circuit 24. A location of a memory cell, wherein data is read and written, is different from those in the normal operation mode due to the operation of the test write data selection circuit 12 and the test read data selection circuit 26. Furthermore, during the test mode, data written into the parity cell array PCA are supplied through the external parity data terminals PDQ1-2. Accordingly, the write error correction circuit 14, the parity generation circuit 16, the syndrome generation circuit 18, the write syndrome decoder 20 and the read syndrome decoder 22 are inactivated and thus stopped, as described above.

FIG. 9 is a view illustrating the outline of the read operation and the write operation during the normal operation mode. The positional relation between the regular cell arrays CA1L-CA4L, CA1R-CA4R, and the parity cell arrays PCAL, PCAR are the same as those of FIG. 2. Four truncated square edges each connected to plural sets of the main data lines MD1-4 indicate four column switches CSW that are selected by a column selection line CSL and four sense amplifiers SA corresponding to the four column switches CSW, among the column switch CSW and the sense amplifier SA shown in FIG. 4. Each of numbers written in the square edges indicates a physical location of the column switch CSW and the sense amplifier SA.

In the normal operation mode, when addresses A1-0 are "00", data D1-16 are input to and output from a regular cell array CA1 (CA1L and CA1R). When the addresses A1-0 are "01", "10" and "11", data D17-32, D33-48 and D49-64 are each input to and output from a regular cell array CA2 (CA2L and CA2R), CA3 (CA3L and CA3R) and CA4 (CA4L and CA4R). Parity cell arrays PCAL, PCAR store parity data CR1-7 of the data D1-64 written into the regular cell arrays CA1-4. On a lower side of FIG. 9, data that are input and output according to the addresses A1-0 are indicated by half-tone dot meshes. Furthermore, whenever the addresses A1-0 change, the 16-bit data indicated by the half-tone dot meshes are input to and output from the external data terminals DQ1-16. Every addresses A1-0, the 16-bit data indicated by the half-tone dot meshes are selected by the write data selection circuit 10 and the read data selection circuit 24 shown in FIG. 1.

FIG. 10 is a view illustrating the outline of the read operation and the write operation in test mode. The positional relation between the regular cell arrays CA1L-CA4L, CA1R-CA4R, and parity cell arrays PCAL, PCAR is the same as that of FIG. 2. FIG. 10 is the same as FIG. 9 except that data (indicated by the half-tone dot meshes), which are input and output according to the addresses A1-0, are different. Furthermore, in the test mode, not only data of the regular cell arrays CA1L-CA4L and CA1R-CA4R are input and output through the external data terminals DQ1-16, but also data of the parity cell arrays PCAL and PCAR are input and output through the external parity data terminals PDQ1-2.

In the test mode, in all of the regular cell arrays CA1L-CA4L and CA1R-CA4R, and the parity cell arrays PCAL and PCAR, 1-bit data are input to and output from the data terminals DQ1-16 and PDQ1-2 every segment SG shown in FIG. 2. 16-bit regular data (test data) indicated by half-tone dot meshes every addresses A1-0 are selected by the test write data selection circuit 12 and the test read data selection circuit 26 shown in FIG. 1. In other words, the test write data selection circuit 12 writes the test data, which are received through the external data terminals DQ1-16 during the test mode, into each of the segments SG of the regular cell arrays CA1-4. The test read data selection circuit 26 outputs the test data, which are read from each of the segments SG of the regular cell arrays CA1-4 during the test mode, to each of the external data terminals DQ1-16. For this reason, the test read data selection circuit 26 can preferably have sub-circuits the number of which is the same as that of the segment SG, as shown in FIG. 5. The test write data selection circuit 12 can preferably have sub-circuits the number of which is the same as that of the segment SG, as shown in FIG. 7. This facilitates the logic designs of the test read data selection circuit 26 and the test write data selection circuit 12. This results in reduction in the logic design period and the design verify period.

The 2-bit parity data (test parity data) indicated by the half-tone dot meshes every addresses A1-0 are selected by the parity write data selection circuit 30 and the parity read data selection circuit 32. The parity write data selection circuit 30 writes test parity data, which are received through the respective external parity data terminals PDQ1-2 during the test mode, into each of the segments SG of the parity cell array PCA. The parity read data selection circuit 32 outputs test parity data, which are read from each of the segments SG of the parity cell array PCA during the test mode, to each of the external parity data terminals PDQ1-2.

As shown in FIG. 10, according to the present invention, during the test mode, data are written into a regular memory cell and a parity memory cell, which are located relatively at the same location within the regular cell arrays CA1-4 and the parity cell array PCA, and are then read from these memory cells. That is, in the test mode, the physical location relation (address map) of a memory cell MC where data are read and written can be made to correspond to the regular cell arrays CA1-4 and the parity cell array PCA. (during the normal operation mode and test mode, the address map of the regular cell arrays CA1-4 can be changed). In other words, in the test mode, regular bit and parity bit can be physically mapped to the same address. Accordingly, a common test pattern can be used in order to a test regular memory cell and a parity memory cell. It is also possible to easily find the relation between a regular cell array where failure has occurred and a parity cell array. As a result, the design time of test patterns can be reduced, and the time necessary for failure analysis can be thus reduced. That is, test cost can be curtailed.

The write pattern shown in FIG. 9 and the write pattern shown in FIG. 10 can be switched depending upon whether the write data selection circuit 10 or the test write data selection circuit 12 will be driven. The same is true of the switching of the read data selection circuit 24 and the test read data selection circuit 26. Accordingly, a location of a memory cell where data are read and written can be easily switched by activation of the write data selection circuit 10 and the read data selection circuit 24, or activation of the test write data selection circuit 12 and the test read data selection circuit 26. The switching of the operating mode can be easily carried out according to a logic level of the test signal TES. Resultantly, data can be read from and written into memory cells having relatively the same location through a simple circuit.

Figure 11:
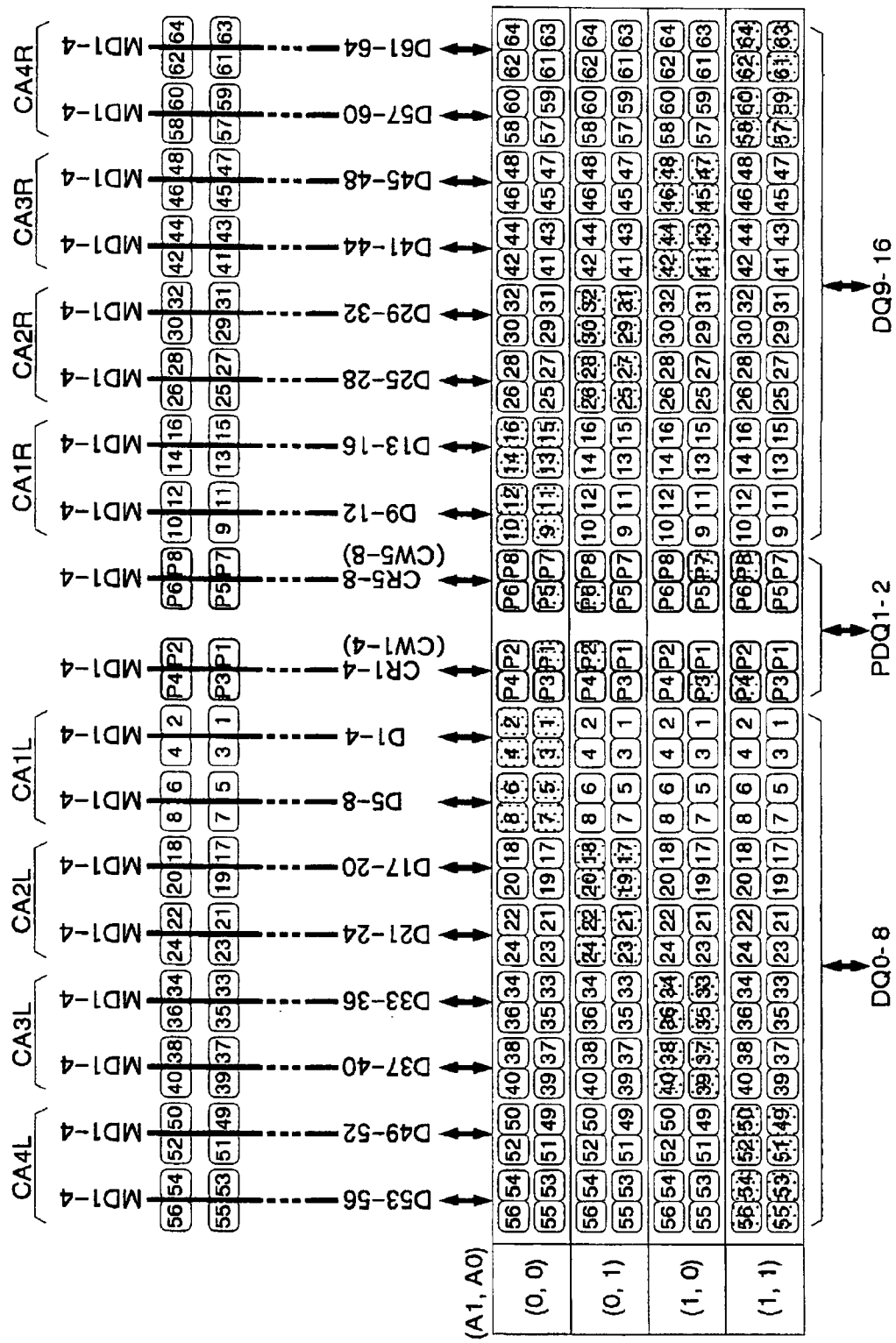
FIG. 11 is an explanatory diagram illustrating the outline of the read operation and the write operation in the test mode in a pseudo SRAM to which the present invention is not applied.

FIG. 11 is a view illustrating the outline of the read operation and the write operation during test mode in a pseudo SRAM to which the present invention is not applied. If the test write data selection circuit 12 and the test read data selection circuit 26 do not exist, a location on the regular cell arrays CA1L-CA4L and CA1R-CA4R of data that are input and output according to the addresses A1-0 is the same as that of the normal operation mode (FIG. 9). Therefore, in the regular cell arrays CA1-4 and the parity cell array PCA, the physical positional relation of a memory cell MC where data are written or read is not the same. As a result, failure analysis into bit failure of the memory cell MC becomes complicated. A test pattern for testing a pseudo SRAM is needed in the regular cell arrays CA1-4 and the parity cell array PCA, respectively. This results an increases in test cost.

As described above, in the present embodiment, the test control circuit activates the test write data selection circuit 12 and the test read data selection circuit 26 and inactivates the write data selection circuit 10 and the read data selection circuit 24, during the test mode. Through such switching, a location of a memory cell where data are read and written is changed depending upon a normal operation mode. Therefore, a physical location of a regular memory cell where data are read and written can be made to correspond to a physical location of a parity memory cell. As a result, the design time of test patterns can be cut down, and the time necessary for failure analysis can be reduced accordingly. This results in reduction in test cost.

Furthermore, in the aforementioned embodiment, a case where the present invention is applied to a pseudo SRAM has been described as an example. It is, however, to be noted that the present invention is not limited to such an embodiment. For instance, the same effect can be obtained when the present invention is applied to other semiconductor memories such as DRAM, SRAM and a ferroelectric memory.

The present invention can be also applied to a pseudo SRAM including 128-bit regular cell arrays CA1-4 having a bit width of 128 bits and a parity cell array PCA having a bit width of 8 bits. In this case, an external data terminal DQ is not limited to 16 bits, but can be 8 bits or 32 bits. According to the present invention, a significant effect can be obtained by applying data supplied to the external data terminal to a semiconductor memory in which data is written into any one of regular cell arrays selected according to an address.

The invention is not limited to the above embodiments and various modifications may be made without departing from the spirit and scope of the invention. Any improvement may be made in part or all of the components.

What is claimed is:

1. A semiconductor memory comprising:
   a plurality of external data terminals inputting and outputting data;
   a plurality of regular cell arrays having regular memory cells where data, which are input to and output from the external data terminals, are read and written and where said data is written to one of said regular cell arrays during a normal operation mode;
   a plurality of external parity data terminals inputting and outputting test parity data during a test mode;
   a parity cell array having parity memory cells in which parity data of data written into the regular cell arrays during a normal operation mode are read and written, and the test parity data are thus read and written during the test mode, where allocations of addresses differ in said normal operation mode and in said test mode;
   a normal write data selection circuit outputting the data received through the external data terminals to any one of the regular cell arrays selected according to an address, in the normal operation mode;
   a normal read data selection circuit outputting to the external data terminals the data read from any one of the regular cell arrays, which is selected according to the address in the normal operation mode;
   a test write control circuit writing a test data into a regular memory cell at a location corresponding to a location of a parity memory cell into which the test parity data are written, the test write control circuit operating in the test mode, and said test data are written in the regular memory cells in each said regular cell arrays; and
   a test read control circuit reading the test data from the regular memory cell at the location corresponding to the location of the parity memory cell from which the test parity data are read, the test read control circuit operating in the test mode, and said test data are read from the regular memory cells in each said regular cell arrays.

2. The semiconductor memory according to claim 1, wherein the allocation of the addresses of said regular memory cells differ in said normal operation mode and said test mode.

3. The semiconductor memory according to claim 1, wherein the test write control circuit comprises:
   a test write data selection circuit that selects, according to the address, the regular memory cell from each of the regular cell arrays into which the test data are written; and
   a parity write data selection circuit that selects, according to the address, the parity memory cell from the parity cell array into which the test parity data are written.

4. The semiconductor memory according to claim 3, wherein:
   the regular cell arrays and the parity cell array are each composed of a plurality of segments;
   a total number of the segments of the regular cell arrays is the same as the number of the external data terminals;
   a total number of the segments of the parity cell array is the same as the number of the external parity data terminals;
   the test write data selection circuit writes the test data received through each of the external data terminals into each of the segments of the regular cell arrays; and
   the parity write data selection circuit writes the test parity data received through each of the external parity data terminals into each of the segments of the parity cell array.

5. The semiconductor memory according to claim 4, further comprising a plurality of data lines respectively connected to the segments of the regular cell arrays, wherein
   the test write data selection circuit comprises a test write address decoder that activates any one of the plurality of write decode signals according to the address, and a write data output circuit that outputs the test data to any one of the data lines according to a write decode signal, the test write address decoder and the write data output circuit being formed in every segment.

6. The semiconductor memory according to claim 3, wherein the test read control circuit comprises:
   a test read data selection circuit selecting, according to the address, any one of plural bits of test data that are read from the regular memory cells from each of the regular cell arrays, and then outputting the selected bit to the external data terminals; and
   a parity read data selection circuit selecting, according to an address, any one of plural bits of test parity data that are read from the parity memory cells of the parity cell array, and then outputting the selected bit to the external parity data terminals.

7. The semiconductor memory according to claim 6, wherein:
   the regular cell arrays and the parity cell array are each composed of a plurality of segments;
   a total number of the segments of the regular cell arrays is the same as the number of the external data terminals;
   a total number of the segments of the parity cell array is the same as the number of the external parity data terminals;
   the test read data selection circuit outputs the test data read from each of the segments of the regular cell arrays to each of the external data terminals; and
   the parity read data selection circuit outputs the test parity data read from each of the segments of the parity cell array to each of the external parity data terminals.

8. The semiconductor memory according to claim 7, further comprising a plurality of data lines respectively connected to the segments of the regular cell arrays, wherein
   the test read data selection circuit comprises a test read address decoder that activates any one of the plurality of read decode signals according to the address, and a read data output circuit that outputs any one of the plural bits of the test data read by the data lines to the external data terminals according to the read decode signals, wherein the test read address decoder and the read data output circuit are formed every segment.

9. The semiconductor memory according to claim 3, wherein:
   the test write data selection circuit comprises an output circuit that has its output terminals set to a high impedance state during the normal operation mode; and
   the normal write data selection circuit comprises an output circuit that has its output terminals set to a high impedance state during the test mode.

10. The semiconductor memory according to claim 3, wherein:
    the test read data selection circuit comprises an output circuit that has its output terminals set to a high impedance state during the normal operation mode; and
    the normal read data selection circuit comprises an output circuit that has its output terminals set to a high impedance state during the test mode.

* * * * *